(12) United States Patent
Hashimoto et al.

(10) Patent No.: US 10,091,444 B2
(45) Date of Patent: Oct. 2, 2018

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventors: Seiji Hashimoto, Yokohama (JP); Hidekazu Takahashi, Zama (JP); Atsushi Furubayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 105 days.

(21) Appl. No.: 14/812,963

(22) Filed: Jul. 29, 2015

(65) Prior Publication Data

US 2016/0037116 A1    Feb. 4, 2016

(30) Foreign Application Priority Data

Jul. 31, 2014  (JP) .................................. 2014-156783

(51) Int. Cl.
*H04N 5/374* (2011.01)
*H04N 5/3745* (2011.01)
(Continued)

(52) U.S. Cl.
CPC ....... *H04N 5/3742* (2013.01); *H01L 27/1461* (2013.01); *H01L 27/14609* (2013.01);
(Continued)

(58) Field of Classification Search
CPC .. H04N 5/3742; H04N 5/378; H04N 5/37452; H04N 9/045; H04N 5/3745;
(Continued)

(56) References Cited

U.S. PATENT DOCUMENTS

| 4,902,886 A | 2/1990 | Smisko |
| 2009/0085135 A1 | 4/2009 | Bang |

(Continued)

FOREIGN PATENT DOCUMENTS

| CN | 102480601 A | 5/2012 |
| EP | 1267411 A2 | 12/2002 |

(Continued)

*Primary Examiner* — Tony Ko
(74) *Attorney, Agent, or Firm* — Canon U.S.A., Inc. IP Division

(57) ABSTRACT

A photoelectric conversion apparatus including a plurality of photoelectric conversion units each of which includes a first electrode, a second electrode, a photoelectric conversion layer which accumulates signal charges and which is disposed between the first and second electrodes, and an insulating layer disposed between the photoelectric conversion layer and the second electrode, an amplification unit configured to receive optical signals and output signals each based on one of the optical signals, each of the optical signals being based on one of the signal charges, each of the signal charges being accumulated in one of the plurality of photoelectric conversion units, and a capacitive element having a first node and a second node, the first node being connected to the second electrodes of the plurality of photoelectric conversion units and the amplification unit and the second node selectively receiving each one of a plurality of potentials having different values.

28 Claims, 9 Drawing Sheets

(51) Int. Cl.
  *H04N 9/04* (2006.01)
  *H01L 27/146* (2006.01)
  *H01L 31/0352* (2006.01)
  *H04N 5/378* (2011.01)

(52) U.S. Cl.
  CPC .. *H01L 27/14612* (2013.01); *H01L 27/14627* (2013.01); *H01L 27/14641* (2013.01); *H01L 27/14647* (2013.01); *H01L 27/14667* (2013.01); *H01L 31/035218* (2013.01); *H04N 5/378* (2013.01); *H04N 5/3745* (2013.01); *H04N 5/37452* (2013.01); *H04N 9/045* (2013.01)

(58) Field of Classification Search
  CPC ......... H01L 27/14647; H01L 27/14667; H01L 27/14609; H01L 31/035218; H01L 27/14641; H01L 27/14627; H01L 27/14612; H01L 27/1461
  See application file for complete search history.

(56) References Cited

U.S. PATENT DOCUMENTS

| | | | |
|---|---|---|---|
| 2009/0224351 A1 | 9/2009 | Hsieh | |
| 2012/0127353 A1* | 5/2012 | Sato | H04N 5/32 348/300 |

FOREIGN PATENT DOCUMENTS

| | | | |
|---|---|---|---|
| JP | H09-275201 A | 10/1997 | |
| JP | 2002-350551 A | 12/2002 | |
| JP | 1391288 A | 1/2003 | |
| JP | 2014-078870 A | 5/2014 | |

\* cited by examiner

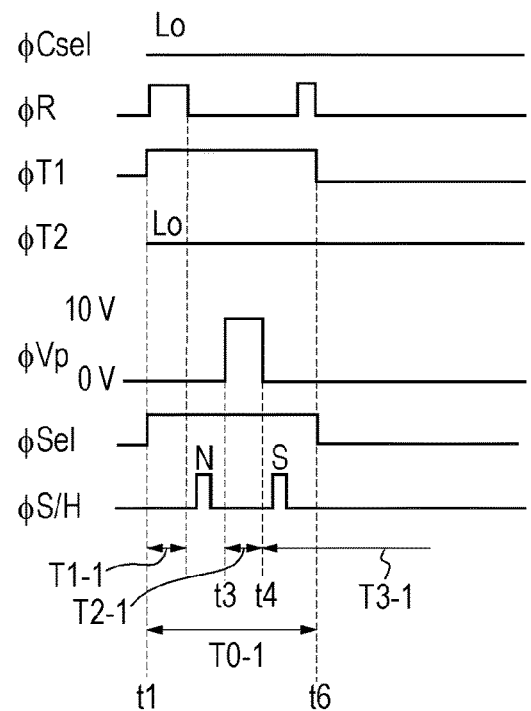
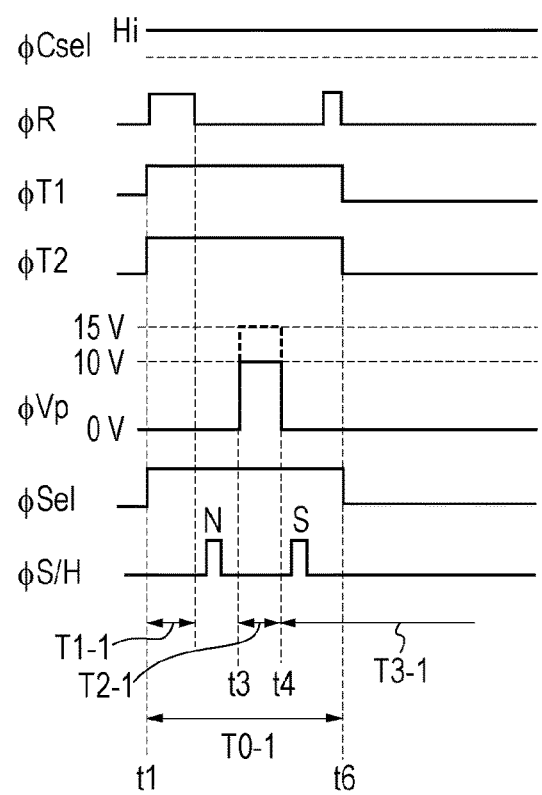

PHOTOELECTRIC CONVERSION APPARATUS AND PHOTOELECTRIC CONVERSION SYSTEM

BACKGROUND OF THE INVENTION

Field of the Invention

The present disclosure relates to a photoelectric conversion apparatus and a photoelectric conversion system.

Description of the Related Art

Japanese Patent Laid-Open No. 2002-350551 discloses a photoelectric conversion apparatus including a photoelectric conversion unit, a capacitive element, a transfer transistor, and an amplifier. The photoelectric conversion unit includes a first electrode, a second electrode which is disposed near a substrate relative to the first electrode, and a photoelectric conversion layer disposed between the first and second electrodes. The capacitive element accumulates signal charges supplied from the second electrode. The transfer transistor outputs the signal charges accumulated by the capacitive element to the amplifier.

The photoelectric conversion apparatus disclosed in Japanese Patent Laid-Open No. 2002-350551 includes the capacitive element and the photoelectric conversion unit in the one-to-one relationship. Accordingly, a large circuit area is required in the photoelectric conversion apparatus.

SUMMARY OF THE INVENTION

The present disclosure provides a photoelectric conversion apparatus including a plurality of photoelectric conversion units each of which includes a first electrode, a second electrode, a photoelectric conversion layer which accumulates signal charges and which is disposed between the first and second electrodes, and an insulating layer disposed between the photoelectric conversion layer and the second electrode, an amplification unit configured to receive optical signals and output signals each based on one of the optical signals, each of the optical signals being based on one of the signal charges, each of the signal charges being accumulated in one of the plurality of photoelectric conversion units, and a capacitive element having a first node and a second node, the first node being connected to the second electrodes of the plurality of photoelectric conversion units and the amplification unit and the second node selectively receiving each one of a plurality of potentials having different values.

Further features of the present invention will become apparent from the following description of exemplary embodiments with reference to the attached drawings.

BRIEF DESCRIPTION OF THE DRAWINGS

FIGS. 6A and 6B are diagrams illustrating operations of a photoelectric conversion apparatus.

DESCRIPTION OF THE EMBODIMENTS

Embodiments of a photoelectric conversion apparatus will be described hereinafter with reference to the accompanying drawings.

First Embodiment

Figure 1:
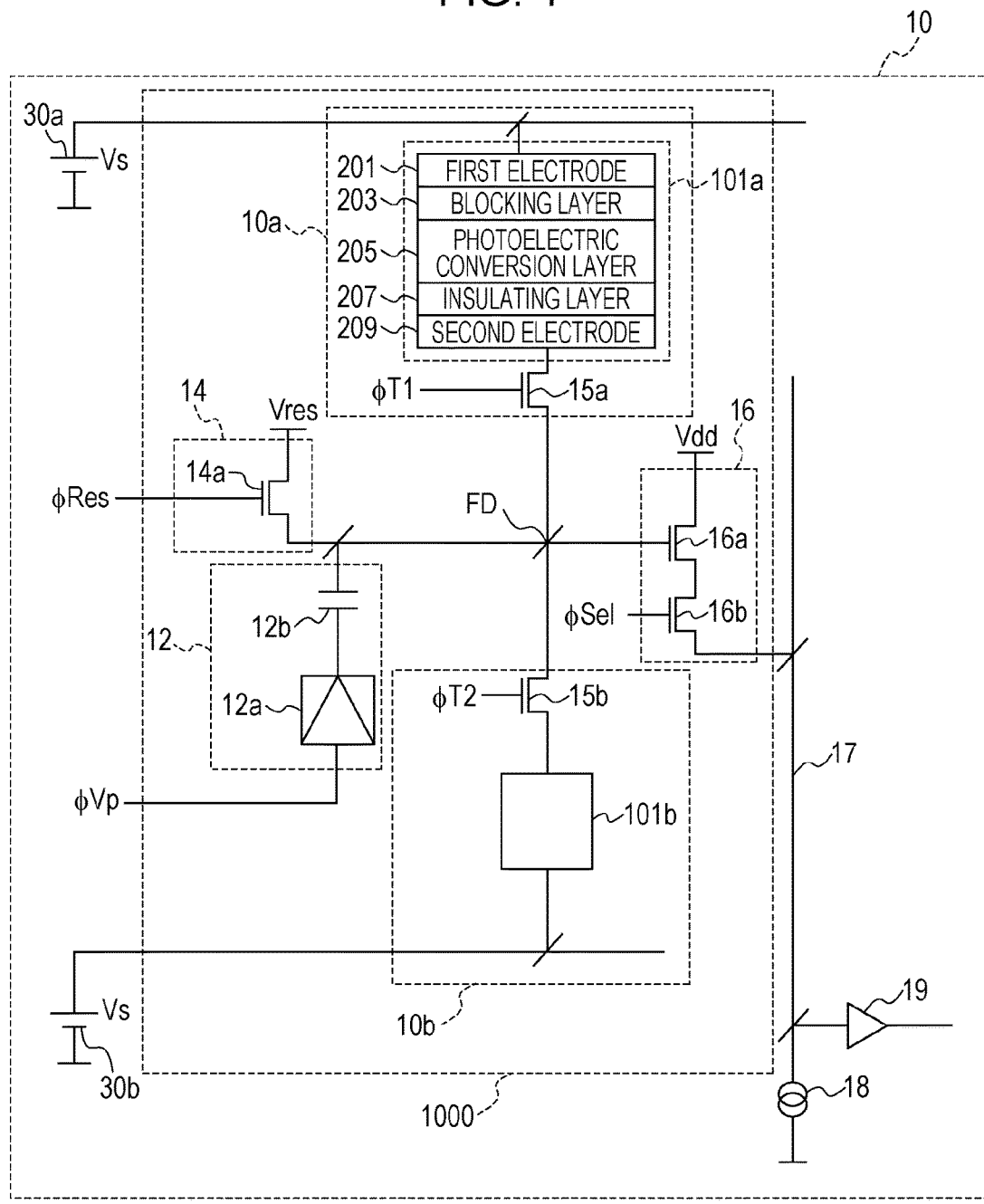
FIG. 1 is a diagram illustrating a configuration of a photoelectric conversion apparatus.

FIG. 1 is a diagram illustrating a configuration of a photoelectric conversion apparatus according to a first embodiment.

A photoelectric conversion apparatus 10 illustrated in FIG. 1 includes a pixel cell 1000, a capacitor driving unit 12, a vertical signal line 17, a current source 18, and a column amplification unit 19. The photoelectric conversion apparatus 10 further includes power source units 30a and 30b.

The pixel cell 1000 includes unit pixels 10a and 10b, a resetting unit 14, and a pixel output unit 16.

The unit pixel 10a includes a photoelectric conversion unit 101a and a transfer transistor 15a. Similarly, the unit pixel 10b includes a photoelectric conversion unit 101b and a transfer transistor 15b. The photoelectric conversion unit 101a includes a first electrode 201, a blocking layer 203, a photoelectric conversion layer 205, an insulating layer 207, and a second electrode 209. The blocking layer 203 is disposed between the first electrode 201 and the photoelectric conversion layer 205, and the photoelectric conversion layer 205 is disposed between the blocking layer 203 and the insulating layer 207. Furthermore, the insulating layer 207 is disposed between the photoelectric conversion layer 205 and the second electrode 209. The photoelectric conversion unit 101b may have a configuration the same as that of the photoelectric conversion unit 101a. Hereinafter, the photoelectric conversion unit 101a will be described. The transfer transistors 15a and 15b are disposed so as to correspond to the photoelectric conversion units 101a and 101b, respectively. The transfer transistors 15a and 15b function as transfer units which transfer optical signals of the photoelectric conversion units 101a and 101b, respectively, to an amplification transistor 16a functioning as an amplification unit.

The first electrode 201 is formed by a conductive member having high transmissivity of light having a wavelength range which may be sensed by the photoelectric conversion layer 205. For example, a compound including indium and/or tin, such as indium tin oxide (ITO) or a compound including ZnO is used as a material of the first electrode 201. By this, the photoelectric conversion layer 205 of this embodiment may obtain a larger amount of light than in a case where an opaque electrode using copper or the like is used as the first electrode 201. As another example, the first electrode 201 of this embodiment may be formed by polysilicon or metal having a thickness allowing a predetermined amount of light to be transmitted.

The blocking layer 203 suppresses injection of charges having a polarity which is the same as that of signal charges accumulated in the photoelectric conversion layer 205 from the first electrode 201 to the photoelectric conversion layer 205. The photoelectric conversion layer 205 is depleted by a potential difference between a potential Vs applied to the first electrode 201 and a potential of the second electrode 209. Furthermore, a gradient of a potential of the photoelectric conversion layer 205 is inverted depending on the relationship between the potential Vs applied to the first electrode 201 and the potential of the second electrode 209. With this configuration, the photoelectric conversion layer 205 may accumulate signal charges and discharge the accumulated signal charges. An operation of the photoelectric conversion unit 101*a* will be described hereinafter.

Note that, in this embodiment, a power source voltage supplied to the first electrode 201 corresponds to the potential Vs supplied from the power source units 30*a* and 30*b*.

The photoelectric conversion layer 205 is formed of intrinsic amorphous silicon (hereinafter referred to as "a-Si"), a low-concentration P-type a-Si, a low-concentration N-type a-Si, or the like. Alternatively, the photoelectric conversion layer 205 may be formed of a compound semiconductor. Examples of the compound semiconductor include a III-V family compound semiconductor, such as BN, GaAs, GaP, AlSb, or GaAlAsP, a II-VI family compound semiconductor, such as CdSe, ZnS, or HdTe, and a IV-VI family compound semiconductor, such as PbS, PbTe, or CuO. Alternatively, the photoelectric conversion layer 205 may be formed of an organic material. For example, fullerene, coumarin 6 (C6), rhodamine 6G (R6G), zinc phthalocyanine (ZnPc), Quinacridone, a phthalocyanine compound, a naphthalocyanine compound, or the like may be used. Furthermore, a quantum dot film including the compound semiconductor described above may be used as the photoelectric conversion layer 205.

When the photoelectric conversion layer 205 is formed of a semiconductor, a semiconductor having a low impurity concentration or an intrinsic semiconductor is used. With this configuration, a sufficiently-large depletion layer may be ensured in the photoelectric conversion layer 205, and therefore, effects of high sensitivity and noise reduction may be obtained.

The blocking layer 203 may be formed by an N-type or a P-type semiconductor of a material which is the same as that of the semiconductor used for the photoelectric conversion layer 205 and which has an impurity concentration higher than that of the semiconductor used for the photoelectric conversion layer 205. When a-Si is used for the photoelectric conversion layer 205, N-type a-Si which has been doped with an impurity or P-type a-Si which has been doped with an impurity is used for the blocking layer 203, for example. Since a position of a Fermi level varies depending on impurity concentration, the blocking layer 203 functions as a potential barrier only for electrons or holes.

When the photoelectric conversion layer 205 includes a quantum dot film, the blocking layer 203 is formed of a material which is the same as a material of a semiconductor used for the quantum dot film and which has a conductive type different from that of the quantum dot film. For example, when the quantum dot film is P-type PbS, the blocking layer 203 is formed of N-type PbS. Furthermore, although a material which is the same as a material of the quantum dot film and which has a conductive type the same as that of the quantum dot film is used for the blocking layer 203, the material of the quantum dot film and the material of the blocking layer 203 have different impurity concentrations.

Alternatively, the blocking layer 203 may be formed of a material different from that of the photoelectric conversion layer 205. With this configuration, a heterojunction is formed. Since different bandgaps are obtained due to a difference between the materials, a potential barrier may be formed only for electrons or holes. When the photoelectric conversion layer 205 includes the quantum dot film, PbS may be used for the quantum dot film and ZnO may be used for the blocking layer 203, for example.

The insulating layer 207 is interposed between the photoelectric conversion layer 205 and the second electrode 209. As a material of the insulating layer 207, amorphous silicon oxide (hereinafter referred to as "a-SiO"), amorphous silicon nitride (hereinafter referred to as "a-SiN"), or an organic material is used. In one embodiment, the insulating layer 207 has a thickness which does not allow signal charges to be transmitted due to a tunnel effect. With this configuration, leak current may be reduced, and accordingly, noise may be reduced. Specifically, the insulating layer 207 has a thickness of 50 nm or more.

When an amorphous film is used for the blocking layer 203, the photoelectric conversion layer 205, and the insulating layer 207, a hydrotreatment process may be performed so as to terminate a dangling bond with hydrogen. With this configuration, noise may be reduced.

The second electrode 209 is formed of a conductive member, such as metal. A material which is the same as a material of a conductive member which forms wiring or a material which is the same as a material of a conductive member which forms a pad electrode used for external connection is used for the second electrode 209. With this configuration, in the photoelectric conversion unit 101*a* of this embodiment, the second electrode 209 and the conductive member forming wiring or the pad electrode may be simultaneously formed. Accordingly, the photoelectric conversion unit 101*a* of this embodiment may be fabricated by a simple process when compared with a case where the second electrode 209 is formed by a material different from that of the conductive member forming wiring or the pad electrode.

The first electrode 201 of the photoelectric conversion unit 101*a* is electrically connected to the power source unit 30*a*. The power source unit 30*a* supplies a potential Vs to the first electrode 201. A first electrode of the photoelectric conversion unit 101*b* is electrically connected to the power source unit 30*b*. The power source unit 30*b* supplies a potential Vs to the first electrode of the photoelectric conversion unit 101*b*.

The transfer transistor 15*a* is electrically connected to the second electrode 209 of the photoelectric conversion unit 101*a*. Furthermore, the transfer transistor 15*b* is electrically connected to a second electrode of the photoelectric conversion unit 101*b*. A signal φT1 is supplied from a vertical scanning circuit, not illustrated, to a gate of the transfer transistor 15*a*. Furthermore, A signal φT2 is supplied from the vertical scanning circuit, not illustrated, to a gate of the transfer transistor 15*b*.

The resetting unit 14 includes a reset transistor 14*a*. A reset potential Vres is supplied to one of a source and a drain of the reset transistor 14*a* and the other one of the source and the drain is electrically connected to a node FD. The reset potential Vres is smaller than the potential Vs. In this embodiment, it is assumed that the potential Vs is 5 V and the reset potential Vres is 2 V. Furthermore, a signal φRes is supplied from the vertical scanning circuit, not illustrated, to a gate of the reset transistor 14*a*.

The capacitor driving unit 12 includes a buffer circuit 12*a* and a capacitive element 12*b*. A first node which is one of nodes of the capacitive element 12*b* is electrically connected to the node FD. Specifically, the first node of the capacitive element 12*b* is electrically connected to the photoelectric conversion units 101*a* and 101*b* in common through the transfer transistors 15*a* and 15*b*, respectively, serving as transfer units. A second node which is the other of the nodes of the capacitive element 12*b* is electrically connected to the buffer circuit 12*a*. A signal φVp is supplied from a timing generator, not illustrated, disposed separately from the vertical scanning circuit to the buffer circuit 12a. The buffer circuit 12a supplies a potential obtained by buffering potentials of the signals φVp to the capacitive element 12b. The timing generator, not illustrated, is a potential supplying unit which supplies the signals φVp having different potentials to the capacitive element 12b through the buffer circuit 12a.

The capacitive element 12b is electrically connected to the node FD. The capacitive element 12b includes two electrodes which face each other, for example. The two electrodes are formed of polysilicon or metal. Alternatively, the capacitive element 12b includes a semiconductor region and a polysilicon electrode disposed on the semiconductor region. With the configuration in which the capacitive element 12b is connected to the node FD, noise may be reduced when an optical signal is read from the photoelectric conversion unit 101a. This noise reduction operation will now be described.

The photoelectric conversion apparatus 10 of this embodiment performs control of the potential of the node FD. The potential of the second electrode 209 of the photoelectric conversion unit 101a varies depending on the ratio of a capacitance value of the node FD (a gate capacitance of the amplification transistor 16a) to a capacitance value of a capacitance component between the first electrode 201 and the second electrode 209 (hereinafter referred to as a capacitance value of the photoelectric conversion unit 101a). This is because the node FD and the photoelectric conversion unit 101a are considered as two capacitances connected in series.

The photoelectric conversion apparatus 10 of this embodiment performs control of the potential of the node FD. The potential of the second electrode 209 of the photoelectric conversion unit 101a varies depending on the ratio of a capacitance value of the capacitive element 12b to a combined capacitance of a gate capacitance of the amplification transistor 16a and a capacitance value of a capacitive component between the first electrode 201 and the second electrode 209 (hereinafter referred to as a capacitance value of the photoelectric conversion unit 101a) which are connected by the node FD. This is because the capacitive element 12b and the combined capacitance are considered as two capacitances connected in series.

In the photoelectric conversion apparatus 10 of this embodiment, the larger the capacitance value of the capacitive element 12b is, the larger the amount of change in the potential of the second electrode 209 is when the signal φVp is changed.

According to this embodiment, the capacitive element 12b is electrically connected to the node FD. The node of the capacitive element 12b to which the potential of the signal φVp is supplied and the node FD are electrically separated from each other.

Accordingly, when the potential of the second electrode 209 is controlled so that an optical signal is read from the photoelectric conversion unit 101a, a large potential difference may be applied between the first electrode 201 and the second electrode 209. By this, the photoelectric conversion apparatus 10 of this embodiment may easily deplete the photoelectric conversion layer 205. Accordingly, the sensitivity of the photoelectric conversion unit 101a relative to incident light is improved. Furthermore, since a potential of the photoelectric conversion layer 205 at a time when accumulation of signal charges is started based on the incident light is substantially stable, noise included in the optical signal may be reduced.

The pixel output unit 16 includes the amplification transistor 16a and a selection transistor 16b. A gate of the amplification transistor 16a is electrically connected to the node FD. Furthermore, a potential Vdd is input to one of a source and a drain of the amplification transistor 16a, and the other of the source and the drain of the amplification transistor 16a is electrically connected to one of a source and a drain of the selection transistor 16b. The other of the source and the drain of the selection transistor 16b is electrically connected to the vertical signal line 17. Furthermore, a signal φSel is supplied from the vertical scanning circuit, not illustrated, to a gate of the selection transistor 16b. The amplification transistor 16a which is an amplification unit outputs a signal obtained by amplifying the signal output from the second electrode 209.

The current source 18 is electrically connected to the selection transistor 16b through the vertical signal line 17. When the selection transistor 16b is turned on, a source follower circuit is formed by the amplification transistor 16a and the current source 18.

An input node of the column amplification unit 19 is electrically connected to the vertical signal line 17. An output node of the column amplification unit 19 is electrically connected to a signal holding unit, not illustrated. The signal holding unit, not illustrated, is electrically connected to an output unit, not illustrated. A signal output from the output unit, not illustrated, corresponds to a signal output from the photoelectric conversion apparatus 10.

The photoelectric conversion apparatus 10 illustrated in FIG. 1 includes the single capacitive element 12b and the single amplification transistor 16a for the photoelectric conversion units 101a and 101b which are the plurality of photoelectric conversion units. Specifically, the single capacitive element 12b and the single amplification transistor 16a are shared by the photoelectric conversion units 101a and 101b.

Although only the single pixel cell 1000 is illustrated in FIG. 1, a plurality of pixel cells are arranged in a matrix of several thousand rows by several thousand columns in practice. Furthermore, the vertical signal line 17, the current source 18, and the column amplification unit 19 are disposed for each column including a plurality of pixel cells 1000 arranged therein. The plurality of pixel cells 1000 are arranged in a pixel region. Furthermore, the column amplification unit 19 is disposed in a peripheral circuit region set outside the pixel region. The peripheral circuit region is a region outside orthogonal projection of the first electrodes 201 which are individually included in the plurality of photoelectric conversion units 101.

Next, an operation of the photoelectric conversion unit 101a of this embodiment will be described. FIGS. 2A to 2D are diagrams schematically illustrating energy bands in the photoelectric conversion unit 101a. In FIGS. 2A to 2D, energy bands of the first electrode 201, the blocking layer 203, the photoelectric conversion layer 205, the insulating layer 207, and the second electrode 209 are illustrated. In FIGS. 2A to 2D, the vertical axis represents a potential relative to electrons. The potential relative to electrons increases upward in FIGS. 2A to 2D. Accordingly, the potential decreases downward in FIGS. 2A to 2D. A Fermi level is represented in the first electrode 201 and the second electrode 209. A bandgap between an energy level of a conduction band and an energy level of a valence band is represented in the blocking layer 203 and the photoelectric conversion layer 205.

As an operation of the photoelectric conversion unit 101a, steps (1) to (5) below are repeatedly performed. (1) Resetting of an input node of an amplification unit, (2) Reading of a noise signal, (3) Transferring of signal charges from a photoelectric conversion unit, (4) Reading of an optical signal, and (5) Accumulation of signal charges. Hereinafter, each of the steps will be described.

Figure 2A:
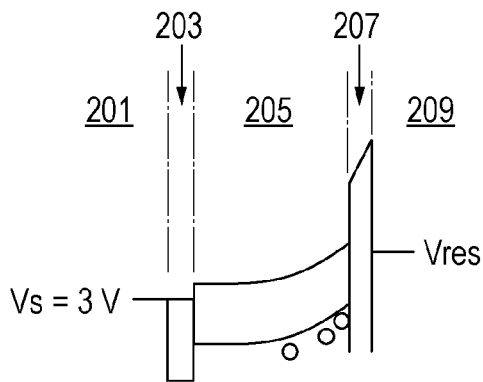
FIGS. 2A to 2D are diagrams illustrating an operation of a photoelectric conversion unit.

FIG. 2A is a diagram illustrating a state of the photoelectric conversion unit 101a in steps (1) and (2). The potential Vs is supplied to the first electrode 201. The first potential Vs is 3 V, for example. Holes denoted by white circles are accumulated in the photoelectric conversion layer 205 as signal charges generated in an exposure period. The surface potential of the photoelectric conversion layer 205 on an insulating layer 207 side changes in accordance with the number of accumulated holes. Furthermore, the buffer circuit 12a supplies a first potential Vd1 to the capacitive element 12b. The first potential Vd1 is 0 V, for example.

In this state, the reset transistor 14a is turned on. By this, the potential of a node including the second electrode 209, that is, the potential of the node FD is reset to a reset potential Vres. The reset potential Vres is 1 V, for example. Since the node FD is connected to the gate of the amplification transistor 16a, the node FD is an input node of the amplification unit. Therefore, the input node of the amplification unit is reset.

Thereafter, the reset transistor 14a is turned off. By this, the node FD enters an electrically-floating state. Here, reset noise may be generated by the reset transistor 14a. The accumulated holes of the signal charges are maintained in the photoelectric conversion layer 205.

When the selection transistor 16b is turned on, the amplification transistor 16a outputs a noise signal including the reset noise.

Figure 2B:
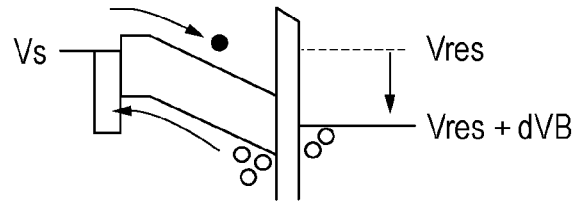
Figure 2C:
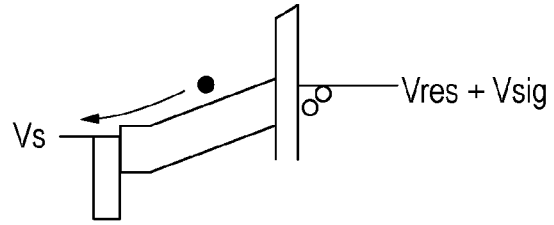

FIGS. 2B and 2C are diagrams illustrating states of the photoelectric conversion unit 101a in step (3). First, the buffer circuit 12a supplies a second potential Vd2 to the capacitive element 12b. Since the holes are used as the signal charges, the second potential Vd2 is higher than the first potential Vd1. The second potential Vd2 is 5 V, for example.

Here, the potential of the second electrode 209 (the node FD) is changed in a direction the same as the direction of change in the potential supplied by the buffer circuit 12a. A change amount dVB of the potential of the second electrode 209 is determined in accordance with the ratio of a capacitance value C1 of the capacitive element 12b electrically connected to the node FD to a capacitance value C2 of the photoelectric conversion unit 101a. The change amount dVB is represented as follows:

$$dVB = (Vd2 - Vd1) \times C1/(C1+C2) \quad (1)$$

In a description below, it is assumed that the capacitance values C1 and C2 are equal to each other for simplicity of description. Accordingly, the change amount dVB is represented as follows:

$$dVB = (Vd2 - Vd1) \times (1/2) \quad (2)$$

Note that, in this embodiment, it is assumed that the capacitance value of the photoelectric conversion unit 101b is also equal to the capacitance value C2 of the photoelectric conversion unit 101a.

In this embodiment, the change amount dVB of the potential of the second electrode 209 is sufficiently larger than a difference between the potential Vs of the second electrode 209 and the reset potential Vres (Vs−Vres). Therefore, the potential of the second electrode 209 becomes lower than the potential of the first electrode 201 and a gradient of the potential of the photoelectric conversion layer 205 becomes inverted. By this, an electron denoted by a black circle is injected from the first electrode 201 to the photoelectric conversion layer 205. Furthermore, some or all of the holes accumulated in the photoelectric conversion layer 205 as signal charges are moved to the blocking layer 203. The moved holes are coupled with a number of carriers in the blocking layer 203 again and disappear. As a result, the holes in the photoelectric conversion layer 205 are discharged from the photoelectric conversion layer 205. When the entire photoelectric conversion layer 205 is to be depleted, all of the holes accumulated as the signal charges are discharged.

Subsequently, in the state illustrated in FIG. 2C, the buffer circuit 12a supplies the first potential Vd1 to the capacitive element 12b. By this, the gradient of the potential of the photoelectric conversion layer 205 becomes inverted again. Therefore, the electron injected in the photoelectric conversion layer 205 in the state of FIG. 2B is discharged from the photoelectric conversion layer 205. Meanwhile, the blocking layer 203 reduces an amount of injection of the holes from the first electrode 201 to the photoelectric conversion layer 205. Therefore, the potential of the node FD is changed from the reset state by a potential Vsig corresponding to a number of disappearing holes. Specifically, the potential Vsig, which corresponds to a number of holes accumulated as signal charges, appears in the node FD. The potential Vsig corresponding to a number of accumulated holes is referred to as an "optical signal component".

Here, the selection transistor 16b is turned on in a state illustrated in FIG. 2C. By this, the amplification transistor 16a outputs an optical signal. A difference between the noise signal read in step (2) and the optical signal read in step (4) represents a signal based on the potential Vsig corresponding to the accumulated signal charges.

Figure 2D:
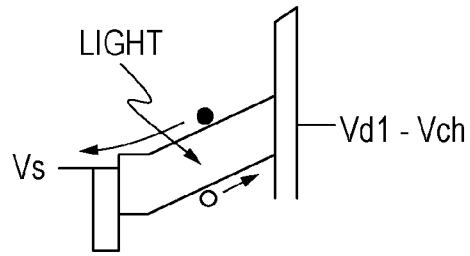

FIG. 2D is a diagram illustrating a state of the photoelectric conversion unit 101a in step (5). The potential Vs is supplied to the first electrode 201, and the reset potential Vres is supplied to the node FD. Since the reset potential Vres is lower than the potential Vs of the first electrode 201, the electron in the photoelectric conversion layer 205 is discharged to the first electrode 201. On the other hand, the holes in the photoelectric conversion layer 205 are moved to an interface between the photoelectric conversion layer 205 and the insulating layer 207. However, since the holes are not allowed to be moved to the insulating layer 207, the holes accumulate in the photoelectric conversion layer 205. Furthermore, the blocking layer 203 suppresses injection of holes to the photoelectric conversion layer 205 as described above. Accordingly, when light is incident on the photoelectric conversion layer 205 in this state, among pairs of electrons and holes generated by photoelectric conversion, only the holes are accumulated in the photoelectric conversion layer 205 as signal charges. A potential Vch of the second electrode 209 is changed in accordance with the holes accumulated in the photoelectric conversion layer 205.

In a case where the signal charges correspond to electrons, the second potential Vd2 is lower than the first potential Vd1. Furthermore, in this case, the conductivity type of the blocking layer 203 is opposite to that of the blocking layer 203 of this embodiment. Therefore, gradients of the potentials are inverted in FIGS. 2A to 2D. Other operations are the same.

Next, a timing chart of the photoelectric conversion apparatus 10 illustrated in FIG. 1 will be described with reference to FIG. 3.

Figure 3A:
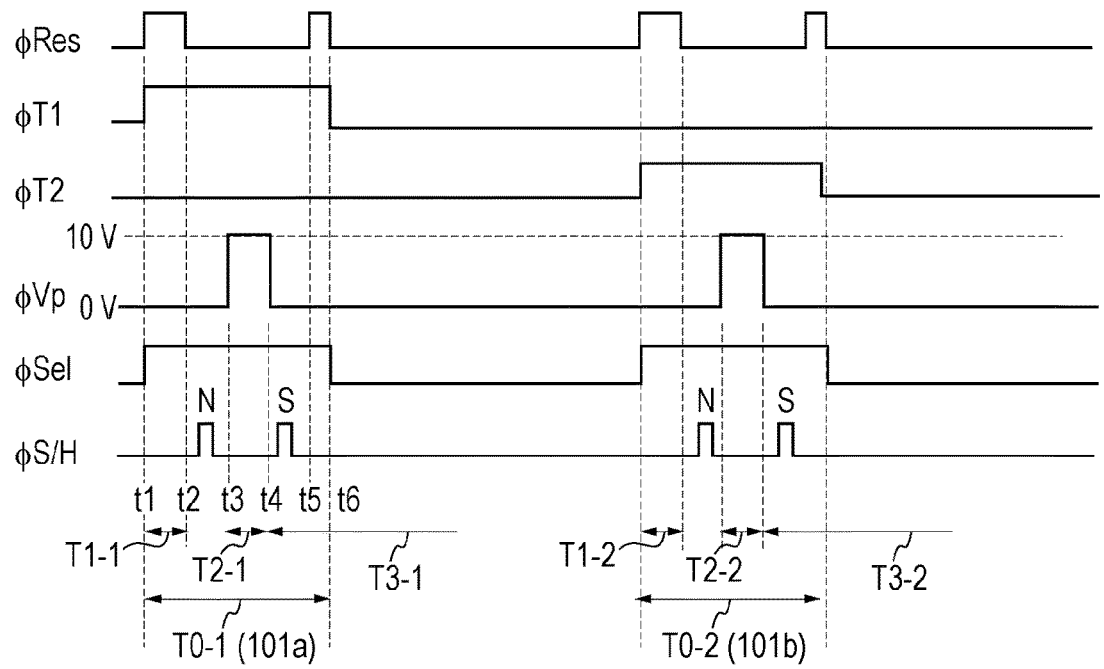
FIGS. 3A and 3B are diagrams illustrating operations of the photoelectric conversion apparatus.
Figure 3B:
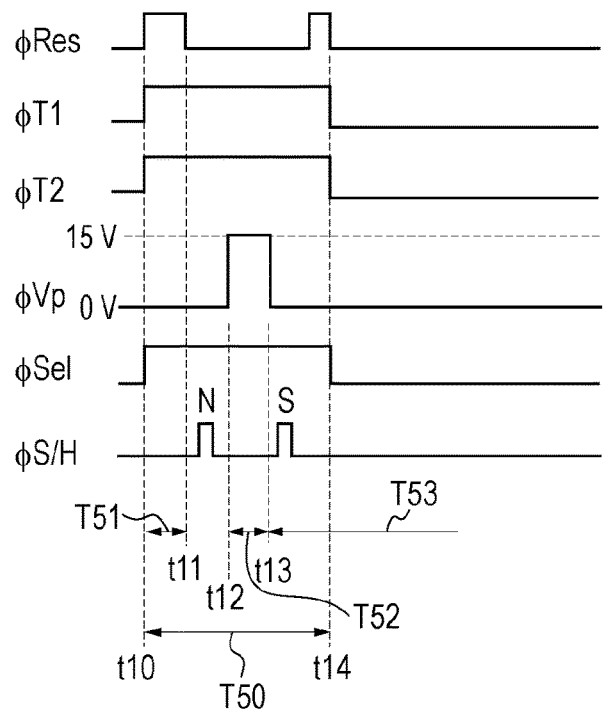

FIG. 3A is a diagram illustrating an operation of individually outputting signals from the photoelectric conversion units 101a and 101b to the node FD. FIG. 3B is a diagram illustrating an operation of outputting a signal obtained by adding optical signals generated by the photoelectric conversion units 101a and 101b to each other to the node FD. Signals illustrated in FIGS. 3A and 3B correspond to the signals illustrated in FIG. 1. A signal φS/H illustrated in FIGS. 3A and 3B is used by the timing generator, not illustrated, to control a sampling operation of the signal holding unit, not illustrated, disposed in a following stage of the column amplification unit 19. The signal holding unit holds a signal output from the column amplification unit 19 when a level of the signal φS/H is changed from a high level (hereinafter referred to as "Hi") to a low level (hereinafter referred to as "Lo").

First, an operation illustrated in FIG. 3A will be described. An operation in a period T0-1 illustrated in FIG. 3A is associated with the photoelectric conversion unit 101a. An operation in a period T0-2 is associated with the photoelectric conversion unit 101b.

At a time point t1, the vertical scanning circuit, not illustrated, changes levels of the signal φRes and the signal φT1 from Lo to Hi. The reset transistor 14a which receives the signal φRes of Hi by the gate thereof is turned on. By this, the potential of the node FD is reset to the potential Vd1. Furthermore, the reset transistor 15a which receives the signal φT1 of Hi by the gate thereof is turned on. By this, an electric path between the second electrode 209 of the photoelectric conversion unit 101a and the node FD is changed from a nonconductive state to a conductive state, and therefore, the potential of the second electrode 209 is reset to the potential Vd1. Furthermore, the vertical scanning circuit sets the signal φSel to Hi. By this, the selection transistor 16b is turned on. Accordingly, the amplification transistor 16a outputs a signal based on the potential of the node FD to the vertical signal line 17.

At a time point t2, the vertical scanning circuit, not illustrated, changes the signal φRes from Hi to Lo. By this, the reset of the node FD is cancelled. The operation performed in a period T1-1 which is a period of time from the time point t1 to the time point t2 corresponds to step (2) described above.

Thereafter, the timing generator, not illustrated, changes the signal φS/H from Lo to Hi, and thereafter, changes the signal φS/H to Lo again. The signal holding unit holds a signal output from the column amplification unit 19 when the signal level of the signal φS/H is changed from Hi to Lo. The signal output from the column amplification unit 19 at this time is a noise signal. This operation corresponds to step (2) described above. In FIG. 3A, the operation associated with the holding of the noise signal performed by the signal holding unit is represented by "N".

Note that, in a period of time until a time point t3 is reached, the buffer circuit 12a supplies the first potential Vd1 to the capacitive element 12b in accordance with the signal φVp of Lo. The signal φVp of Lo is 0 V in this embodiment. The buffer circuit 12a supplies the first potential Vd1 which is 0 V to the capacitive element 12b.

At the time point t3, the timing generator changes the signal φVp from Lo, that is, 0 V, to Hi, that is, 10 V. The buffer circuit 12a supplies the second potential Vd2 which is 10 V to the capacitive element 12b in accordance with the signal φVp of Hi. The change amount dVB of the potential of the second electrode 209 is represented as follows in accordance with Expression (2) above: dVB=(10−0)×(½)=5 (V). Accordingly, the potential of the second electrode 209 is obtained by applying 5 V to the reset potential Vres.

When the signal φVp of Hi is input, the holes of the photoelectric conversion layer 205 are refreshed as illustrated in FIG. 2B. Thereafter, the timing generator changes the signal φVp to Lo. By this, an optical signal is output to the second electrode 209 as illustrated in FIG. 2C. This operation corresponds to step (3) described above. Since the transfer transistor 15a is in an on state, the electric path between the second electrode 209 of the photoelectric conversion unit 101a and the amplification transistor 16a is in a conductive state. Accordingly, the amplification transistor 16a outputs a signal based on the optical signal to the vertical signal line 17. This operation corresponds to step (4) described above. The column amplification unit 19 outputs a signal obtained by amplifying the signal which is based on the optical signal and which is output from the amplification transistor 16a (hereinafter referred to as an "amplified optical signal").

Then the timing generator changes the signal φS/H to Hi, and thereafter, changes the signal φS/H to Lo. By this, the signal holding unit holds the amplified optical signal output from the column amplification unit 19. In FIG. 3A, the operation associated with the holding of the amplified optical signal performed by the signal holding unit is represented by "S".

Next, in a period of time from a time point t5 to a time point t6, residual charges of a lower electrode of the photoelectric conversion unit 101a is reset. By this, the photoelectric conversion unit 101a is ready to perform accumulation of signal charges based on light again as illustrated in FIG. 2D. This operation is performed to prepare for the operation in step (5).

At the time point t6, the vertical scanning circuit sets the signal φT1 to Lo. Furthermore, the vertical scanning circuit sets the signal φSel to Lo. By this, the selection transistor 16b is turned off. Accordingly, output of a signal based on the signal charges accumulated by the photoelectric conversion unit 101a to the vertical signal line 17 is terminated.

By obtaining a difference between the noise signal and the amplified optical signal held by the signal holding unit, the amplified optical signal in which a noise component is reduced may be obtained.

Thereafter, the operation performed using the photoelectric conversion unit 101a is also performed using the photoelectric conversion unit 101b so that a signal based on signal charges accumulated in the photoelectric conversion unit 101b is output to the vertical signal line 17.

Next, an operation illustrated in FIG. 3B will be described. In a description below, points different from the operation described with reference to FIG. 3A are mainly described. In the operation illustrated in FIG. 3B, optical signals of the photoelectric conversion units 101a and 101b are added to each other in the node FD.

At a time point t10, the vertical scanning circuit changes signal levels of the signals φT1 and φT2 from Lo to Hi. By this, both of the transfer transistors 15a and 15b are turned on. Furthermore, the vertical scanning circuit sets the signal φRes to Hi. By this, the potentials of the second electrodes 209 in the photoelectric conversion units 101a and 101b and the potential of the node FD are reset in accordance with the reset potential Vres.

At a time point t11, the vertical scanning circuit sets the signal φRes to Lo.

Then the timing generator changes the signal φS/H to Hi, and thereafter, changes the signal φS/H to Lo. By this, the signal holding unit holds a noise signal.

At a time point t12, the timing generator changes a level of the signal φVp from Lo, that is, 0 V, to Hi, that is, 15 V. Here, the reason that the level of the signal φVp of Hi is 15 V will be described. Assuming that a capacitance value of the photoelectric conversion unit 101b is denoted by "C3", the change amount dVB of the potential of the second electrode 209 represented by Expression (1) is represented as follows in the operation illustrated in FIG. 3B:

$$dVB=(Vd2-Vd1)\times C1/(C1+C2+C3) \quad (3)$$

In this embodiment, an expression "C1=C2=C3" is satisfied, and therefore, Expression (3) may be replaced by Expression (4) below.

$$dVB=(Vd2-Vd1)\times(\tfrac{1}{3}) \quad (4)$$

The change amounts dVB of the potentials of the second electrodes 209 of the photoelectric conversion units 101a and 101b are set to 5 V which is the same as the operation illustrated in FIG. 3A, Vd2 is 15 V since Vd1 is 0 V. Accordingly, the signal φVp is 15 V. A level of the signal φVp of Hi becomes 3/2 times larger than that in the case where the optical signals are individually read from the photoelectric conversion units 101a and 101b as illustrated in FIG. 3A.

The signal φVp is changed from Hi to Lo. Furthermore, since both of the transfer transistors 15a and 15b are in an on state, the electric paths between the second electrodes 209 of the photoelectric conversion units 101a and 101b and the amplification transistor 16a are in a conductive state. Accordingly, the optical signals are supplied from the second electrodes 209 of the photoelectric conversion units 101a and 101b to the node FD. The potential of the node FD corresponds to a potential of a signal obtained by adding the optical signals of the photoelectric conversion units 101a and 101b to each other.

Then the timing generator changes the signal φS/H to Hi, and thereafter, changes the signal φS/H to Lo. By this, the signal holding unit holds a signal obtained by amplifying a signal obtained by adding the optical signals of the photoelectric conversion units 101a and 101b to each other using the amplification transistor 16a and the column amplification unit 19 in this order.

By this, the photoelectric conversion apparatus 10 of this embodiment may individually read optical signals from a plurality of photoelectric conversion units in the operation illustrated in FIG. 3A. Furthermore, the photoelectric conversion apparatus 10 of this embodiment may read a signal obtained by adding the optical signals output from the plurality of photoelectric conversion units to each other in the node FD serving as the input node of the amplification unit.

Furthermore, in the photoelectric conversion apparatus 10 of this embodiment, the single capacitive element 12b and the single amplification transistor 16a are shared by the plurality of photoelectric conversion units 101a and 101b. Accordingly, a circuit area of the pixel cell may be reduced when compared with a case where the single capacitive element 12b and the single amplification transistor 16a are provided for each of the photoelectric conversion units 101a and 101b.

Furthermore, RGB color filters may be provided as Bayer array and a plurality of photoelectric conversion units may be provided for individual colors. In this case, the single capacitive element 12b and the single amplification transistor 16a may be shared by a plurality of photoelectric conversion units including color filters of the same color.

Figure 8:
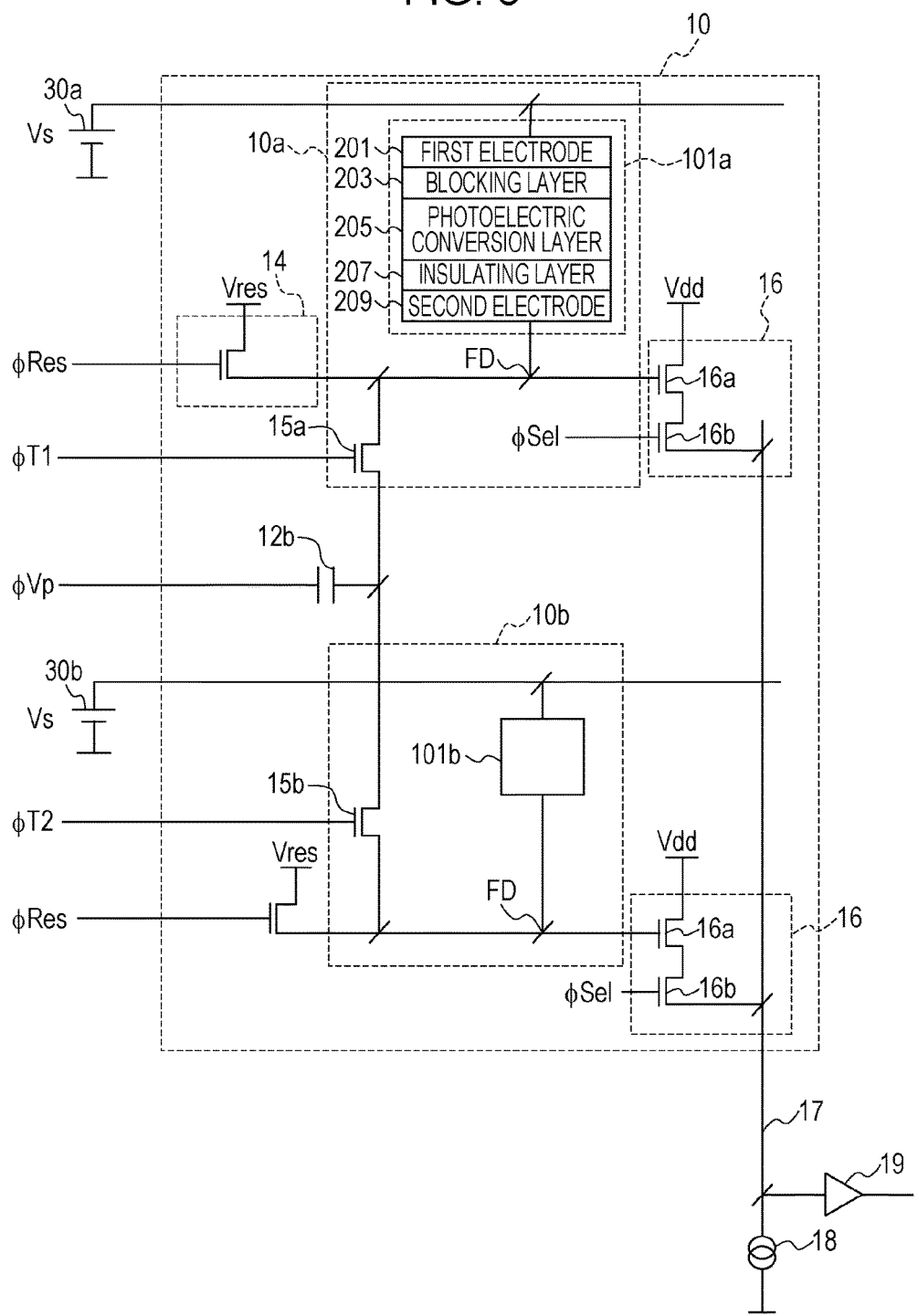
FIG. 8 is a diagram illustrating another configuration of the photoelectric conversion apparatus.

Furthermore, the signal φVp is input to the capacitive element 12b through the buffer circuit 12a from the timing generator. However, as another example, the signal φVp may be input to the capacitive element 12b from the timing generator without using the buffer circuit 12a as illustrated in FIG. 8.

Furthermore, in this embodiment, the single amplification transistor 16a is shared by the plurality of photoelectric conversion units 101a and 101b. However, as another example, a plurality of amplification transistors 16a may be provided so as to correspond to the plurality of photoelectric conversion units 101a and 101b as illustrated in FIG. 8. For example, in a case where a plurality of pixel cells 1000 are arranged in a matrix, each of the plurality of pixel cells 1000 includes a number of amplification transistors 16a corresponding to a number of photoelectric conversion units included in the pixel cell 1000. Then the capacitive element 12b may be shared by the pixel cells 1000 in the same row. In a case where a plurality of capacitive elements 12b are provided, a plurality of buffer circuits 12a are disposed so as to correspond to the plurality of capacitive elements 12b. In this way, since the buffer circuits 12a are provided so as to correspond to the capacitive elements 12b, a load applied to the power supply unit may be reduced. Alternatively, pixel cells 1000 arranged in a matrix of a plurality of rows by a plurality of columns, such as a matrix of 2 rows by 2 columns, may share a single capacitive element 12b.

In this embodiment, the single capacitive element 12b and the single amplification transistor 16a are shared by the two photoelectric conversion units 101a and 101b. That is, the single capacitive element 12b and the single amplification transistor 16a are shared by a plurality of photoelectric conversion units. Furthermore, in a plurality of photoelectric conversion units 101 electrically connected to the node FD in common, when the number of optical signals which are simultaneously read to the node FD is M which is larger than N (N is an integer not less than 1), a level of the signal φVp of Hi is increased when compared with the case where the number of optical signals which are simultaneously read to the node FD is N. This operation is performed when the signal charges accumulated in the photoelectric conversion units 101 are holes. In a case where the signal charges accumulated in the photoelectric conversion units 101 are electrons, when the number of optical signals which are simultaneously read to the node FD is M which is larger than N (N is an integer not less than 1), a level of the signal φVp of Hi is lowered when compared with the case where the number of optical signals which are simultaneously read to the node FD is N.

Figure 4:
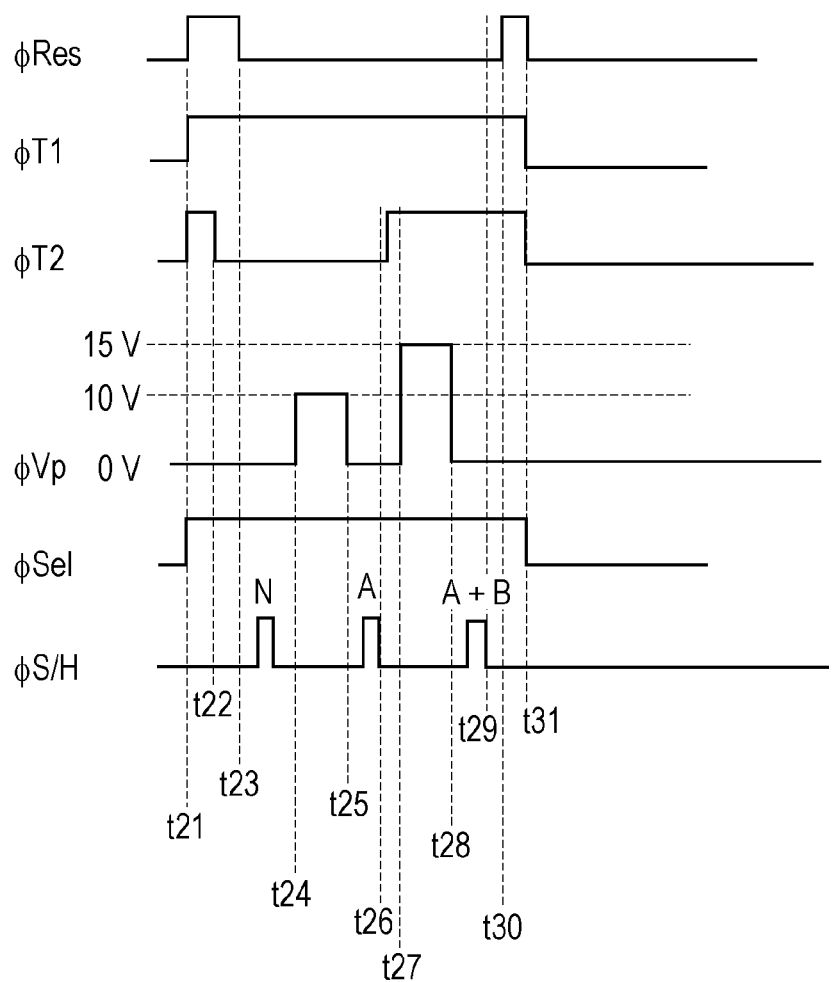
FIG. 4 is a diagram illustrating another operation of the photoelectric conversion apparatus.

Furthermore, the photoelectric conversion apparatus 10 of this embodiment may combine the operation of individually reading optical signals from the plurality of photoelectric conversion units illustrated in FIG. 3A with the operation of reading a signal obtained by adding the optical signals of the plurality of photoelectric conversion units to each other. An example of this operation is illustrated in FIG. 4.

In a period of time from a time point t21 to a time point t26, an operation associated with reading of a noise signal and an optical signal of the photoelectric conversion unit 101a is performed. In a period of time from a time point t27 to a time point t31, an operation associated with reading of a signal obtained by adding the optical signals of the photoelectric conversion units 101a 101b to each other is performed. By this operation, the signal holding unit holds an A signal obtained by amplifying the optical signal of the photoelectric conversion unit 101a using the amplification transistor 16a and the column amplification unit 19 at the time point t26. Furthermore, at a time point t29, the signal holding unit holds an A+B signal obtained by amplifying a signal obtained by adding the optical signals of the photoelectric conversion units 101a and 101b to each other using the amplification transistor 16a and the column amplification unit 19. The photoelectric conversion apparatus 10 individually outputs the A signal and the A+B signal to the outside.

Here, an example of a photoelectric conversion system including the photoelectric conversion apparatus 10 and an output signal processor which processes a signal output from the photoelectric conversion apparatus 10 will be described. The output signal processor installed in an outside of the photoelectric conversion apparatus 10 may obtain a B signal by subtracting the A signal from the A+B signal. The B signal generated by the output signal processor corresponds to a signal obtained by amplifying the optical signal of the photoelectric conversion unit 101b using the amplification transistor 16a and the column amplification unit 19. The photoelectric conversion apparatus 10 may further include a microlens array including a plurality of microlenses, and each of the microlenses may be provided for a single photoelectric conversion unit 101a and a single photoelectric conversion unit 101b. In this case, light beams emitted from different exit pupils of an optical system which guides light to the photoelectric conversion apparatus 10 are individually incident on the plurality of photoelectric conversion units 101a and 101b. With this configuration, the output signal processor may detect a difference between a phase of the light incident on the photoelectric conversion unit 101a and a phase of the light incident on the photoelectric conversion unit 101b using the B signal generated by the output signal processor and the A signal output from the photoelectric conversion apparatus 10. Accordingly, the photoelectric conversion system including the photoelectric conversion apparatus 10 and the output signal processor may perform focus detection by a phase difference detection method. Furthermore, the output signal processor may generate an image using the A+B signal output from the photoelectric conversion apparatus 10. In one embodiment, one of nodes of the single capacitive element 12b is electrically connected to the second electrodes 209 of the plurality of photoelectric conversion units 101 which receive light from the single microlens.

Note that, in this embodiment, the potential of the second electrode 209 is controlled when an optical signal based on the signal charges of the photoelectric conversion unit 101 is read. However, as another example, the photoelectric conversion apparatus 10 of this embodiment may control the first electrode 201 when the optical signal based on the signal charges of the photoelectric conversion unit 101 is read. In this case, a fixed potential, such as a ground potential, is supplied to the node of the capacitive element 12b electrically connected to the buffer circuit 12a in this embodiment.

Note that, although the pixel cell 1000 includes the transfer transistor 15a in this embodiment, the pixel cell 1000 may not include the transfer transistor 15a. Specifically, a first node which is one of the nodes of the capacitive element 12b may be directly connected to the second electrodes 209 of the photoelectric conversion units 101a and 101b. In this case, in a period of time in which the signal φVp is Hi, the first electrode 201 of the photoelectric conversion unit 101 which does not output an optical signal enters a floating state. Meanwhile, the potential Vs is supplied to the first electrode 201 of the photoelectric conversion unit 101 which outputs an optical signal. By this, even in the case where the pixel cell 1000 does not include the transfer transistor 15a, an optical signal may be selectively read to the amplification transistor 16a from the photoelectric conversion units 101 electrically connected to the node FD in common.

The photoelectric conversion units 101 of this embodiment may be Shottky type photoelectric conversion units.

The photoelectric conversion apparatus 10 of this embodiment includes the plurality of photoelectric conversion units 101a and 101b and the amplification transistor 16a. Each of the photoelectric conversion units 101a and 101b includes the first electrode 201, the second electrode 209, the photoelectric conversion layer 205 which accumulates signal charges, and the insulating layer 207. The first node of the capacitive element 12b is electrically connected to the second electrodes 209 of the plurality of photoelectric conversion units 101a and 101b and the amplification transistor 16a. One of a plurality of potentials which have different values is selectively input to the second node of the capacitive element 12b. With this configuration, since the capacitive element 12b is shared by the plurality of photoelectric conversion units 101a and 101b, the number of capacitive elements 12b may be reduced when compared with a case where a single capacitive element 12b is provided for a single photoelectric conversion unit. The photoelectric conversion apparatus 10 of this embodiment may reduce a circuit area of the photoelectric conversion apparatus 10 by reducing the number of capacitive elements 12b.

Second Embodiment

Figure 5:
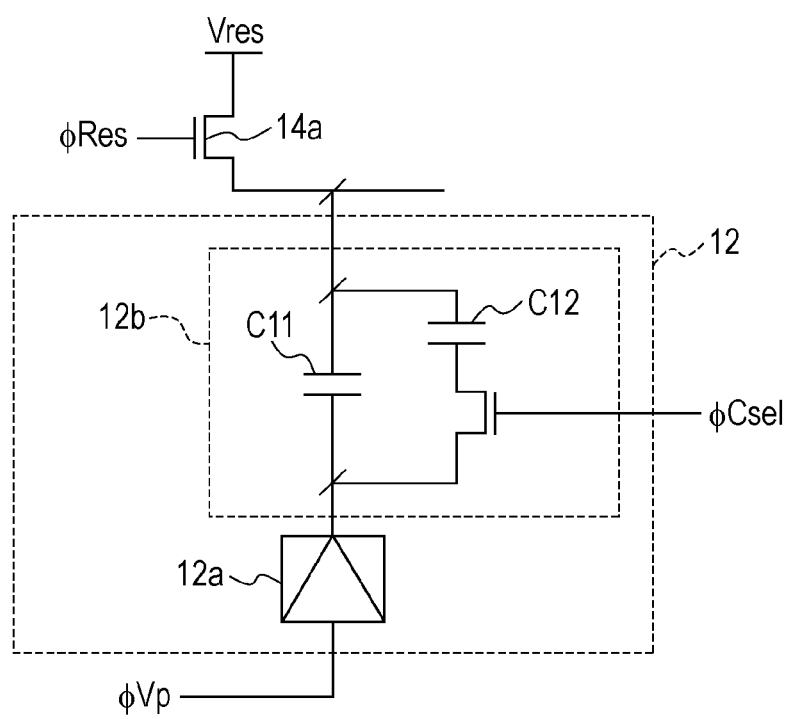
FIG. 5 is a diagram illustrating a configuration of a capacitor driving unit.

Another example of the capacitor driving unit 12 will be described with reference to a configuration illustrated in FIG. 5 and timing charts of FIGS. 6A and 6B.

A capacitor driving unit 12 of a second embodiment includes switches which are arranged in parallel and which are connected to capacitive elements C11 and C12, respectively, in series.

The switches are controlled by a pulse φCsel.

FIG. 6A is a diagram illustrating an operation of individually reading optical signals of photoelectric conversion units 101a and 101b. In the operation of FIG. 6A, a timing generator sets the signal φCsel to Lo. By this, the photoelectric conversion units 101a and 101b are individually driven using the capacitive element C11 without using the capacitive element C12. The operation of FIG. 6A is the same as the operation illustrated in FIG. 3A except for the signal φCsel. A level of the signal φVp of Hi in the operation illustrated in FIG. 6A is 10 V which is the same as that in the operation of FIG. 3A.

FIG. 6B is a diagram illustrating an operation of reading a signal obtained by adding the optical signals of the photoelectric conversion units 101a and 101b to each other in the node FD.

In the operation of FIG. 6B, the timing generator sets the signal φCsel to Hi. Therefore, the photoelectric conversion units 101a and 101b are driven by a combined capacitance of the capacitive elements C11 and C12. It is assumed that a capacitance value of the capacitive element C12 is the same as a capacitance value of the capacitive element C11 in this embodiment. By this, a potential obtained by applying 5 V to a reset potential Vres may be set to potentials of the second electrodes 209 of the two photoelectric conversion units 101a and 101b without changing a level of the signal φVp of Hi from 10 V which is the same as the signal level in the operation illustrated in FIG. 6A. The capacitor driving unit 12 of this embodiment may be operated without differentiating the level of the signal φVp of Hi between a case where the optical signals of the photoelectric conversion units 101a and 101b are individually read and a case where a signal obtained by adding the optical signals of the photoelectric conversion units 101a and 101b to each other is read. Accordingly, a configuration of a circuit which supplies the signal φVp may be simplified in a photoelectric conversion apparatus 10 of this embodiment when compared with the photoelectric conversion apparatus 10 according to the first embodiment.

Note that, although the number of photoelectric conversion units which output optical signals to be added is 2 in the operation illustrated in FIG. 6B of this embodiment, three or more photoelectric conversion units may be employed. In one embodiment, the number of capacitive elements arranged in parallel to the capacitive element C11 of the capacitor driving unit 12 is the same as the number of photoelectric conversion units which output optical signals to be added in a mode in which the number of photoelectric conversion units which output optical signals to be added becomes maximum among operation modes of the photoelectric conversion apparatus.

In this embodiment, the single amplification unit is shared by the plurality of photoelectric conversion units 101a and 101b. Accordingly, a circuit area of a pixel cell 1000 may be reduced in the photoelectric conversion apparatus 10 according to this embodiment when compared with a case where a plurality of amplification units are provided so as to correspond to the plurality of photoelectric conversion units 101a and 101b.

Furthermore, in this embodiment, the capacitor driving unit 12 is shared by the plurality of photoelectric conversion units 101a and 101b. Accordingly, a circuit area of the pixel cell 1000 may be reduced in the photoelectric conversion apparatus 10 according to this embodiment when compared with a case where a plurality of capacitor driving units 12 are provided so as to correspond to the plurality of photoelectric conversion units 101a and 101b.

Note that, also in the photoelectric conversion apparatus 10 of this embodiment, a plurality of amplification transistors 16a may be provided so as to correspond to the plurality of photoelectric conversion units 101a and 101b. For example, in a case where a plurality of pixel cells 1000 are arranged in a matrix, each of the plurality of pixel cells 1000 includes a number of amplification transistors 16a corresponding to a number of photoelectric conversion units included in a corresponding one of the pixel cells 1000. Then the single capacitor driving unit 12 may be shared by pixel cells 1000 in the same row.

Third Embodiment

A photoelectric conversion apparatus according to a third embodiment will be described mainly in points different from the first embodiment.

Figure 7:
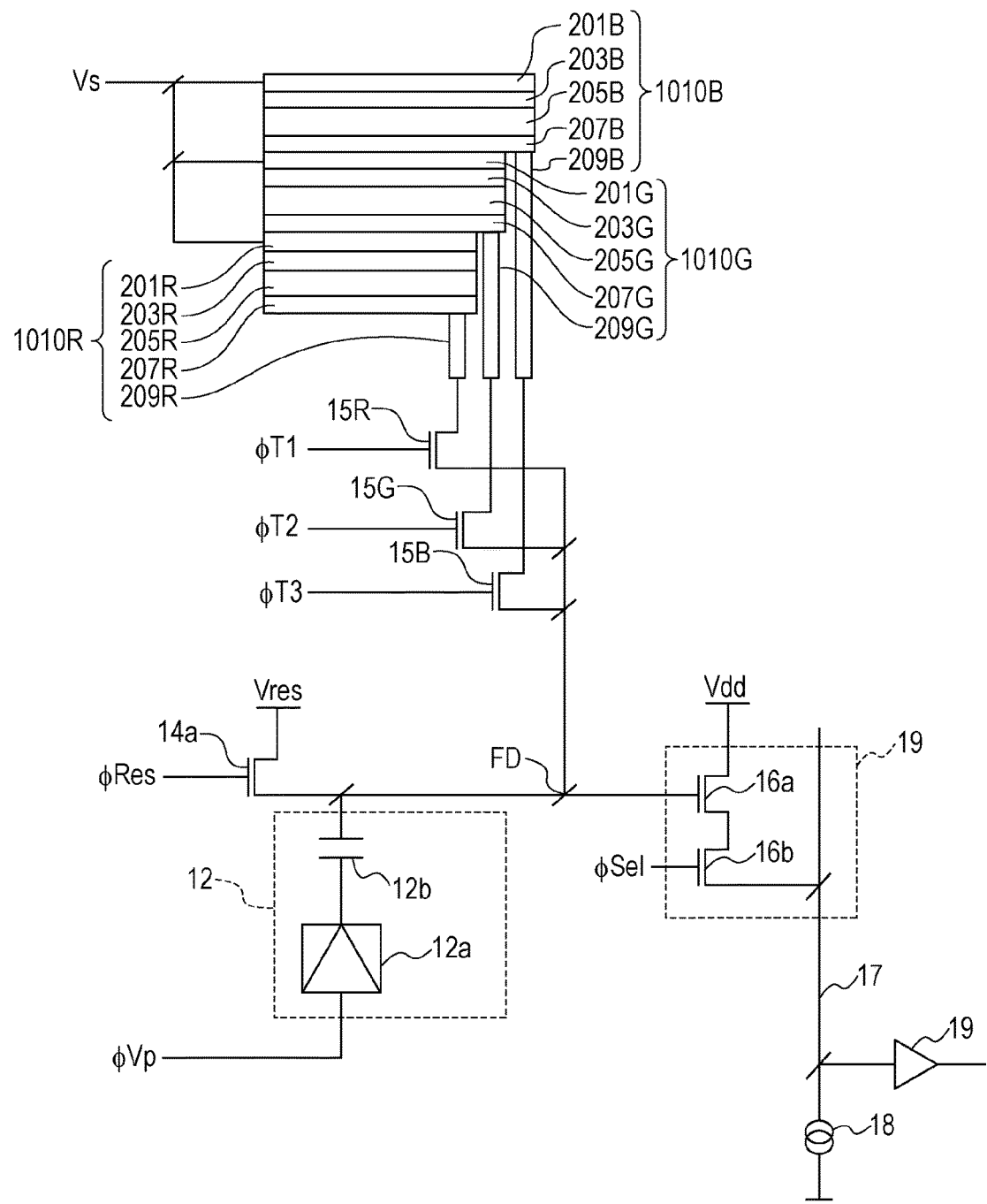
FIG. 7 is a diagram illustrating an operation of a photoelectric conversion apparatus.

FIG. 7 is a diagram illustrating layout of a plurality of photoelectric conversion units which are laminated on one another and a circuit of elements associated with reading of optical signals from the plurality of photoelectric conversion units. The photoelectric conversion apparatus of this embodiment includes a plurality of photoelectric conversion units 1010B, 1010G, and 1010R which are laminated in a depth direction on a semiconductor substrate including a unit cell 1000 disposed thereon. Specifically, the photoelectric conversion apparatus of this embodiment includes the plurality of photoelectric conversion units 1010B, 1010G, and 1010R arranged in this order from a side in which incident light enters. The photoelectric conversion unit 1010B accumulates signal charges based on blue light. The photoelectric conversion unit 1010G accumulates signal charges based on green light. The photoelectric conversion unit 1010R accumulates signal charges based on red light.

The photoelectric conversion unit 1010B includes a first electrode 201B, a blocking layer 203B, a photoelectric conversion layer 205B, an insulating layer 207B, and a second electrode 209B. Configurations of the layers are the same as those of the photoelectric conversion unit 101a according to the first embodiment. The photoelectric conversion unit 1010G and the photoelectric conversion unit 101OR have configurations the same as that of the photoelectric conversion unit 1010B.

A plurality of transfer transistors 15B, 15G, and 15R are electrically connected to the plurality of photoelectric conversion units 1010B, 1010G, and 1010R, respectively. The plurality of transfer transistors 15B, 15G, and 15R are electrically connected to a node FD in common.

Configurations of a capacitor driving unit 12, a resetting unit 14, a pixel output unit 16, a vertical signal line 17, a current source 18, and a column amplification unit 19 are the same as those of the photoelectric conversion apparatus 10 of the first embodiment.

In the photoelectric conversion apparatus of this embodiment, the single capacitor driving unit 12 is shared by the three photoelectric conversion units 1010B, 1010G, and 1010R. Accordingly, the three photoelectric conversion units 1010B, 1010G, and 1010R may be individually driven by the capacitor driving unit 12. Consequently, a circuit area of the pixel cell 1000 may be reduced when compared with a configuration in which capacitor driving units 12 are disposed so as to correspond to the three photoelectric conversion units 1010B, 1010G, and 1010R.

Fourth Embodiment

Figure 9:
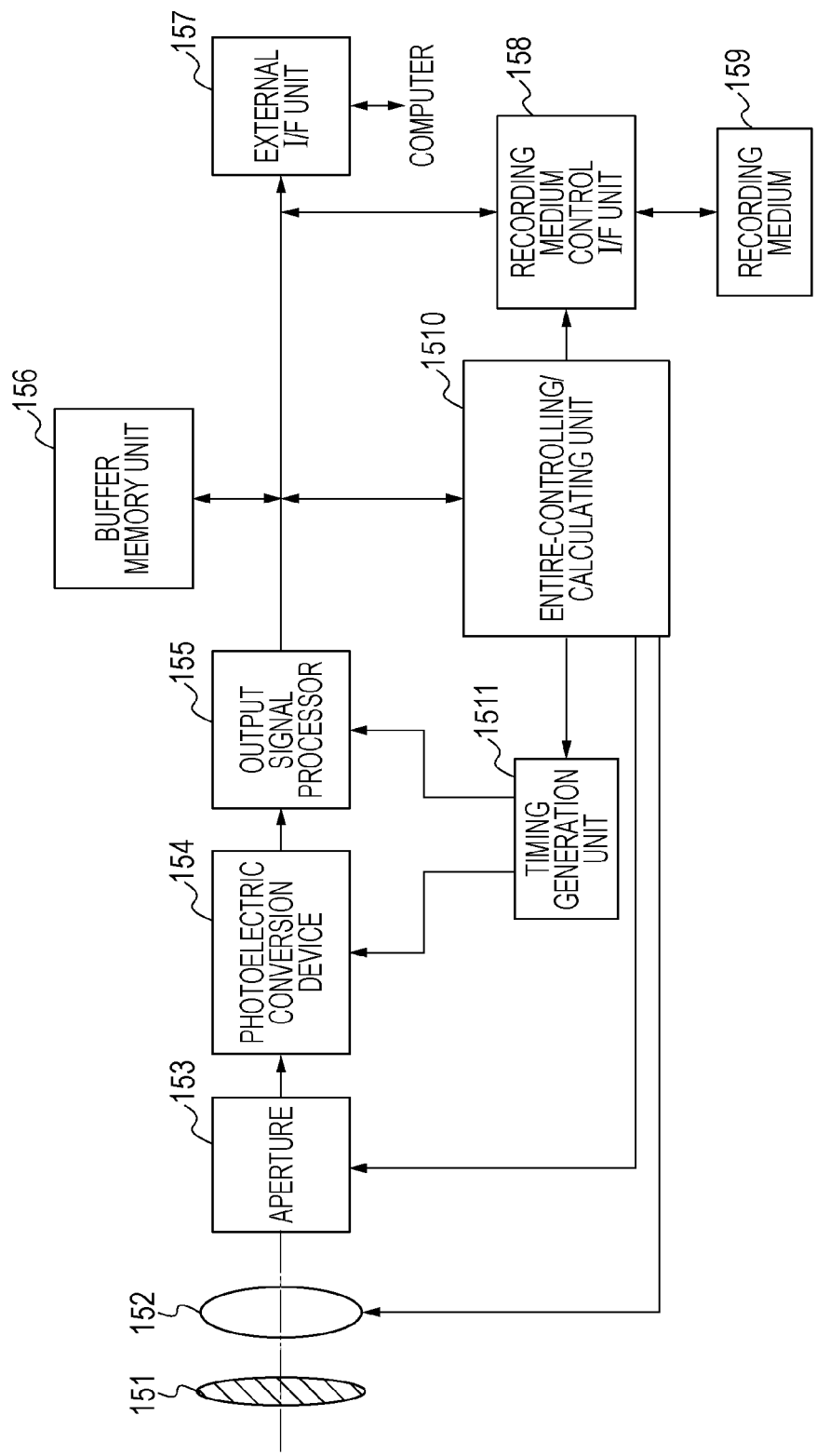
FIG. 9 is a diagram illustrating a configuration of a photoelectric conversion system.

The photoelectric conversion apparatuses according to the first to third embodiment are applicable to various photoelectric conversion systems. Examples of the photoelectric conversion systems include a digital still camera, a digital camcorder, and a surveillance camera. FIG. 9 is a diagram schematically illustrating a photoelectric conversion system to which one of the photoelectric conversion apparatuses according to the first to third embodiments is applied to a digital still camera serving as an example of the photoelectric conversion system.

The photoelectric conversion system illustrated in FIG. 9 includes a photoelectric conversion apparatus 154, a barrier 151 for protecting a lens, a lens 152 for forming an optical image of an object on the photoelectric conversion apparatus 154, and a diaphragm 153 which varies an amount of light which passes the lens 152. The lens 152 and the diaphragm 153 are included in an optical system which guides light to the photoelectric conversion apparatus 154. The photoelectric conversion system illustrated in FIG. 9 further includes an output signal processor 155 which processes a signal output from the photoelectric conversion apparatus 154.

The output signal processor 155 performs AD conversion by converting an analog signal output from the photoelectric conversion apparatus 154 into a digital signal. The output signal processor 155 further performs an operation of outputting image data after performing various correction processes and a compression process where appropriate.

The photoelectric conversion system illustrated in FIG. 9 further includes a buffer memory unit 156 which temporarily stores image data and an external interface unit (external I/F unit) 157 used to communicate with external computers and the like. The photoelectric conversion system further includes a recording medium 159, such as a semiconductor memory, which records or reads captured image data and a recording medium control interface unit (recording medium control I/F unit) 158 used to perform recording and reading on the recording medium 159. Note that the recording medium 159 may be incorporated in the photoelectric conversion system or may be detachable.

The photoelectric conversion system further includes an entire control/calculation unit 1510 which controls various calculations and the entire digital still camera and a timing generator 1511 which outputs various timing signals to the photoelectric conversion apparatus 154 and the output signal processor 155. Here, the timing signals may be externally input, and the photoelectric conversion system at least includes the photoelectric conversion apparatus 154 and the output signal processor 155 which processes a signal output from the photoelectric conversion apparatus 154. As described above, the photoelectric conversion system of this embodiment may perform an image pickup operation using the photoelectric conversion apparatus 154.

Furthermore, the output signal processor 155 may detect a phase difference using signals output from the photoelectric conversion apparatus 154 as described in the first embodiment.

The foregoing embodiments are merely embodied examples of the present invention and the technical scope of the present invention is not limited to the exemplary embodiments. Specifically, the present invention may be embodied in various modes without departing from the technological thought or main characteristics. Furthermore, the foregoing embodiments may be arbitrarily combined with one another.

According to the present invention, a circuit area of a photoelectric conversion apparatus may be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-156783, filed Jul. 31, 2014, which is hereby incorporated by reference herein in its entirety.

What is claimed is:

1. A photoelectric conversion apparatus comprising:
a plurality of photoelectric conversion units arranged in a plurality of rows and a plurality of columns, and each of which includes a first electrode, a second electrode, a photoelectric conversion layer which accumulates signal charges and which is disposed between the first and second electrodes, and an insulating layer disposed between the photoelectric conversion layer and the second electrode, and each of the plurality of photoelectric conversion units configured to output an optical signal based on the signal charges from the second electrode;
a plurality of signal lines;
a plurality of amplification transistors arranged in a plurality of rows and a plurality of columns, each of the plurality of amplification transistors including an output node and a gate; and
a capacitive element having a first node and a second node, the first node being connected to a plurality of second electrodes of photoelectric conversion units among the plurality of photoelectric conversion units and the gate of one of the plurality of amplification transistors, and the second node selectively receiving each one of a plurality of potentials having different values.

2. The photoelectric conversion apparatus according to claim 1, further comprising:
a plurality of transfer transistors,
wherein the plurality of transfer transistors perform switching between a conductive state and a non-conductive state of electric paths between the corresponding second electrodes of the photoelectric conversion units and the gate of the one of the plurality of amplification transistors.

3. The photoelectric conversion apparatus according to claim 2, wherein
a capacitance value of the capacitive element is variable,
wherein the capacitance value of the capacitive element is a first capacitance value in a case where a first number of the plurality of transfer transistors are turned on so that electric paths between the corresponding photoelectric conversion units and the amplification transistor enter a conductive state when the signal charges are discharged from the photoelectric conversion layers, and
wherein the capacitance value of the capacitive element is a second capacitance value which is larger than the first capacitance value in a case where a second number of the plurality of transfer transistors are turned on so that the electric paths between the plurality of photoelectric conversion units and the amplification transistor enter a conductive state when the signal charges are discharged from the photoelectric conversion layers, the second number is larger than the first number.

4. The photoelectric conversion apparatus according to claim 1, wherein the one of the plurality of amplification transistors is disposed for the photoelectric conversion units.

5. The photoelectric conversion apparatus according to claim 1, wherein the second node is connected to a power supply unit which supplies a plurality of potentials.

6. The photoelectric conversion apparatus according to claim 5, further comprising:
a plurality of capacitive elements; and
a plurality of buffer circuits which are disposed so as to correspond to the plurality of capacitance elements and which supply the plurality of potentials to the plurality of capacitive elements from the potential supply unit.

7. The photoelectric conversion apparatus according to claim 5, wherein
the potential supply unit supplies a first potential to the second node so that the photoelectric conversion layer accumulates the signal charges, and
the potential supply unit supplies a potential different from the first potential to the second node so that the signal charges are discharged from the photoelectric conversion layer.

8. The photoelectric conversion apparatus according to claim 7, wherein
in a case where electric paths between N of the plurality of photoelectric conversion units (N is an integer≥1) and the one of the plurality of amplification transistors are in a conductive state, the signal charges are discharged from the photoelectric conversion layers included in the N photoelectric conversion units when the potential supply unit supplies a second potential which is different from the first potential to the second node of the capacitive element,
in a case where electric paths between M of the plurality of photoelectric conversion units (M>N) and the amplification transistor are in a conductive state, the signal charges are discharged from the photoelectric conversion layers included in the M photoelectric conversion units when the potential supply unit supplies a third potential which is different from the first potential to the second node of the capacitive element, and
the signal charges are holes and the third potential is larger than the second potential.

9. The photoelectric conversion apparatus according to claim 7, wherein in a case where electric paths between N of the plurality of photoelectric conversion units (N is an integer≥1) and the one of the plurality of amplification transistors are in a conductive state, the signal charges are discharged from the photoelectric conversion layers included in the N photoelectric conversion units when the potential supply unit supplies a second potential which is different from the first potential to the second node of the capacitive element, in a case where electric paths between M of the plurality of photoelectric conversion units (M>N) and the one of the plurality of amplification transistors are in a conductive state, the signal charges are discharged from the photoelectric conversion layers included in the M photoelectric conversion units when the potential supply unit supplies a third potential which is different from the first potential to the second node of the capacitive element, and the signal charges are electrons and the third potential is smaller than the second potential.

10. The photoelectric conversion apparatus according to claim 1, wherein a single microlens is disposed for the photoelectric conversion units, and after the optical signals are output to the one of the plurality of amplification transistors from the second electrodes of some of the plurality of photoelectric conversion units when electric paths between the some of the photoelectric conversion units and the one of the plurality of amplification transistors are in a conductive state, a signal obtained by adding the optical signals output from the second electrodes of all of the photoelectric conversion units is output to the one of the plurality of amplification transistors when electric paths between all of the photoelectric conversion units and the one of the plurality of amplification transistors are in a conductive state.

11. The photoelectric conversion apparatus according to claim 1, wherein light is incident on the photoelectric conversion apparatus from an optical system, light beams emitted from different exit pupils in the optical system are incident on the plurality of photoelectric conversion units, and after the optical signals are output to the one of the plurality of amplification transistors from the second electrodes of some of the photoelectric conversion units when electric paths between the some of the photoelectric conversion units and the one of the plurality of amplification transistors are in a conductive state, a signal obtained by adding the optical signals output from the second electrodes of all of the photoelectric conversion units is output to the one of the plurality of amplification transistors when electric paths between all of the photoelectric conversion units and the one of the plurality of amplification transistors are in a conductive state.

12. The photoelectric conversion apparatus according to claim 1, wherein the plurality of photoelectric conversion units are disposed on a semiconductor substrate, and the plurality of photoelectric conversion units are stacked in a depth direction of the semiconductor substrate.

13. The photoelectric conversion apparatus according to claim 1, wherein the capacitive element has two electrodes which face each other, one of the two electrodes is the first node of the capacitive element, and the other of the two electrodes is the second node of the capacitive element.

14. The photoelectric conversion apparatus according to claim 1, wherein the capacitive element is disposed on a semiconductor substrate, the first node of the capacitive element is one of a semiconductor region and a gate disposed on the semiconductor region, and the second node is electrically connected to the other of the semiconductor region and the gate disposed on the semiconductor region.

15. The photoelectric conversion apparatus according to claim 1, wherein a power supply voltage is supplied to the first electrode.

16. The photoelectric conversion apparatus according to claim 1, wherein the photoelectric conversion layer includes a quantum dot.

17. The photoelectric conversion apparatus according to claim 1, wherein a blocking layer which suppresses injection of charges having a polarity the same as that of the signal charges from the first electrode to the photoelectric conversion layer is interposed between the first electrode and the photoelectric conversion layer.

18. A photoelectric conversion system comprising:

the photoelectric conversion apparatus according to claim 1; and an output signal processor configured to generate an image by processing signals based on the optical signals output from the photoelectric conversion apparatus.

19. A photoelectric conversion system including the photoelectric conversion apparatus according to claim 1 and an output signal processor, wherein a single microlens is disposed for the photoelectric conversion units which are a part of the plurality of photoelectric conversion units, and wherein the photoelectric conversion apparatus outputs first signals based on the optical signals output from some of the photoelectric conversion units and second signals based on the optical signals output from all of the photoelectric conversion units to the output signal processor, detects phase differences using differences between the first signals and the second signals, and generates an image using the second signals.

20. The photoelectric conversion apparatus according to claim 1, further comprising a plurality of signal lines, wherein each of the plurality of signal lines is arranged corresponding to one of the columns, and each of the amplification transistors outputs the signal based on the optical signal to a corresponding one of the plurality of signal lines.

21. The photoelectric conversion apparatus according to claim 1, further comprising a plurality of reset transistors, each connected to the first node and the gate of corresponding one of the plurality of amplification transistors.

22. The photoelectric conversion apparatus according to claim 1, further comprising a pixel region and a peripheral region arranged at outside the pixel region, wherein the pixel region includes the plurality of amplification transistors, and the peripheral region includes a current source connected to one of the plurality of signal lines.

23. The photoelectric conversion apparatus according to claim 22, wherein the pixel region is a region of orthogonal projection of each of the second electrodes of the plurality of photoelectric conversion units.

24. The photoelectric conversion apparatus according to claim 22, wherein the pixel region further includes the capacitive element.

25. The photoelectric conversion apparatus according to claim 22, wherein the pixel region is a region of orthogonal projection of the first electrode.

26. The photoelectric conversion apparatus according to claim 25, wherein the pixel region further includes the capacitive element.

27. The photoelectric conversion apparatus according to claim 1, wherein the plurality of amplification transistors is arranged in a region of orthogonal projection of the first electrode.

28. The photoelectric conversion apparatus according to claim 27, wherein the pixel region further includes the capacitive element.

* * * * *